(12) United States Patent
Seo

(10) Patent No.: US 8,013,388 B2
(45) Date of Patent: Sep. 6, 2011

(54) SEMICONDUCTOR DEVICE AND METHOD OF MANUFACTURING THE SAME

(75) Inventor: Yong Won Seo, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/345,093

(22) Filed: Dec. 29, 2008

(65) Prior Publication Data

US 2010/0084732 A1    Apr. 8, 2010

(30) Foreign Application Priority Data

Oct. 6, 2008 (KR) ........................ 10-2008-0097734

(51) Int. Cl.
*H01L 29/76* (2006.01)
*H01L 21/336* (2006.01)

(52) U.S. Cl. ................ 257/330; 257/332; 257/E29.257; 438/259; 438/270; 438/589

(58) Field of Classification Search .......... 257/330–332, 257/E29.257; 438/259, 270, 589
See application file for complete search history.

(56) References Cited

U.S. PATENT DOCUMENTS

| | | | |
|---|---|---|---|
| 2003/0224572 A1* | 12/2003 | Yang | 438/257 |
| 2006/0118889 A1* | 6/2006 | Suh | 257/404 |
| 2008/0048253 A1* | 2/2008 | Sun | 257/330 |
| 2009/0023277 A1* | 1/2009 | Kang | 438/589 |
| 2009/0159988 A1* | 6/2009 | Cho | 257/408 |

\* cited by examiner

*Primary Examiner* — Hsien-ming Lee
(74) *Attorney, Agent, or Firm* — Marshall, Gerstein & Borun LLP

(57) ABSTRACT

Disclosed herein is a method of manufacturing a semiconductor device that is adapted to improve the production yield. The method generally includes etching a semiconductor substrate to form a trench, filling the trench with a conductive material, separating the filled conductive material to form a plurality of gate patterns and a bit line contact region, and etching the substrate to define an isolation region.

9 Claims, 6 Drawing Sheets

SEMICONDUCTOR DEVICE AND METHOD OF MANUFACTURING THE SAME

CROSS-REFERENCE TO RELATED APPLICATION

The priority of Korean patent application No. 10-2008-0097734 filed Oct. 6, 2008, the disclosure of which is hereby incorporated in its entirety by reference, is claimed.

BACKGROUND OF THE INVENTION

The invention generally relates to a semiconductor device and a manufacturing method thereof. More particularly, the invention relates to a semiconductor device adapted to improve its production yield and a manufacturing method thereof.

As semiconductor devices become more highly integrated, the line width of the gate has been narrowed, and the gate channel length has decreased. However, this results in the generation of a defect whereby a transistor of the semiconductor device operates abnormally.

To solve this problem, a transistor which includes a recess gate is suggested. The recess gate allows a portion of the semiconductor substrate corresponding to a given gate region to be etched at a fixed depth, in order to increase the contact area between an active region and a gate. As such, the gate channel which lies between source/drain regions positioned on both sides of the gate is lengthened.

However, when the semiconductor substrate is partially etched in the formation of the recess gate, horns can remain because the bottom edges of the recess are not completely removed. Horns may result in the formation of a defective gate in the following process.

Also, a more highly integrated semiconductor device makes it more difficult to adjust the threshold voltage of a transistor by means of only the recess region. To this end, a bulb-type recess having an enlarged bottom portion which is formed in the transistor region is proposed. Although the bottom portion of the recess region is additionally etched in the formation of the bulb-type recess, horn-shaped residuals can remain. In accordance therewith, the defect can be generated and furthermore these residuals can cause a decrease in threshold voltage.

One of the most controversial matters is a short channel effect caused by the decrement of the gate channel length. Actually, the more highly integrated semiconductor devices require elements capable of operating at a higher-speed when at a lower operating voltage of about 1~2 voltage. To this end, the threshold voltage of a transistor must be lowered. However, if the threshold voltage is lowered, it is difficult to control the operation of the transistor due to the short channel effect. Moreover, the short channel effect causes a DIBL (Drain Induced Built-in Leakage) phenomenon involving hot carriers.

To minimize the short channel effect, a variety of aspects regarding the semiconductor device have been researched, but the only way around this problem continues to be the high integration of the semiconductor device. For example, a method controlling the doping concentration has been used for the semiconductor device, but it cannot substantially prevent the short channel effect. Also, a method of forming an SSR (Super Steep Retrograde) channel and an ion implant channel through a vertically abrupt channel doping process has been used. An additional method of forming a halo-shaped channel through a laterally abrupt channel doping process and a large angle tilt implant process has been used.

The manufacturing method of the semiconductor device as described above is an attempt to form a channel length to be long enough to prevent the short channel effect, through the process of forming a gate on an active region and etching the active region to form a recess. However, several factors deteriorate the productivity of the semiconductor device. These factors include the reduced channel length due to the high integration of the semiconductor device, a moat caused by stripping a silicon nitride film during the formation of an isolation film, and a lowered threshold voltage due to the horns generated during the etching process when forming a recess gate.

BRIEF SUMMARY OF THE INVENTION

Various embodiments of the present invention are directed at providing a semiconductor device adapted to improve its production yield (or its productivity) and a manufacturing method thereof.

According to an embodiment of the present invention, a method of manufacturing a semiconductor device includes etching a semiconductor substrate to form a trench, filling the trench with a conductive material, and separating the conductive material to form a bit line contact region and a plurality of gate patterns.

Formation of the trench preferably includes depositing a hard mask layer on the substrate, forming a photo resist pattern on the hard mask layer, and etching the hard mask layer and the substrate using the photo resist pattern as a mask.

The method can also include depositing an oxide film on the trench.

The method can also include, after filling the trench with the conductive material, exposing the semiconductor substrate through planarization.

The method also can include, after forming the gate patterns, etching the semiconductor substrate to define an isolation region.

Preferably, the isolation region is etched to a depth that is greater (i.e., deeper) than that of the gate pattern.

The method can also include depositing an oxide film and a nitride film on the entire surface of the semiconductor substrate including the bit line contact region, depositing an insulation film on the nitride film etching the insulation film within the bit line contact region and filling another conductive material in the etched bit line contact region to form a bit line contact, and forming a bit line over the bit line contact, the bit line including as a stacked structure a barrier metal layer, a conductive layer, and a hard mask nitride film.

The insulation film preferably includes an oxide film.

According to another embodiment, the method can also include etching the insulation film; and forming storage node contacts separated by the isolation region.

According to another embodiment, the invention also include a semiconductor device made by the foregoing method.

The semiconductor device can include a bit line formed on the bit line contact region.

The semiconductor device can also include an isolation region formed by etching the substrate after forming the gate patterns.

The semiconductor device further comprises storage node contacts separate from each other by the isolation region.

Additional features of the disclosed invention may become apparent to those skilled in the art from a review of the following detailed description, taken in conjunction with the drawings and the appended claims.

BRIEF DESCRIPTION OF THE DRAWINGS

For a more complete understanding of the disclosure, reference should be made to the following detailed description and accompanying drawings wherein.

Figure 1:
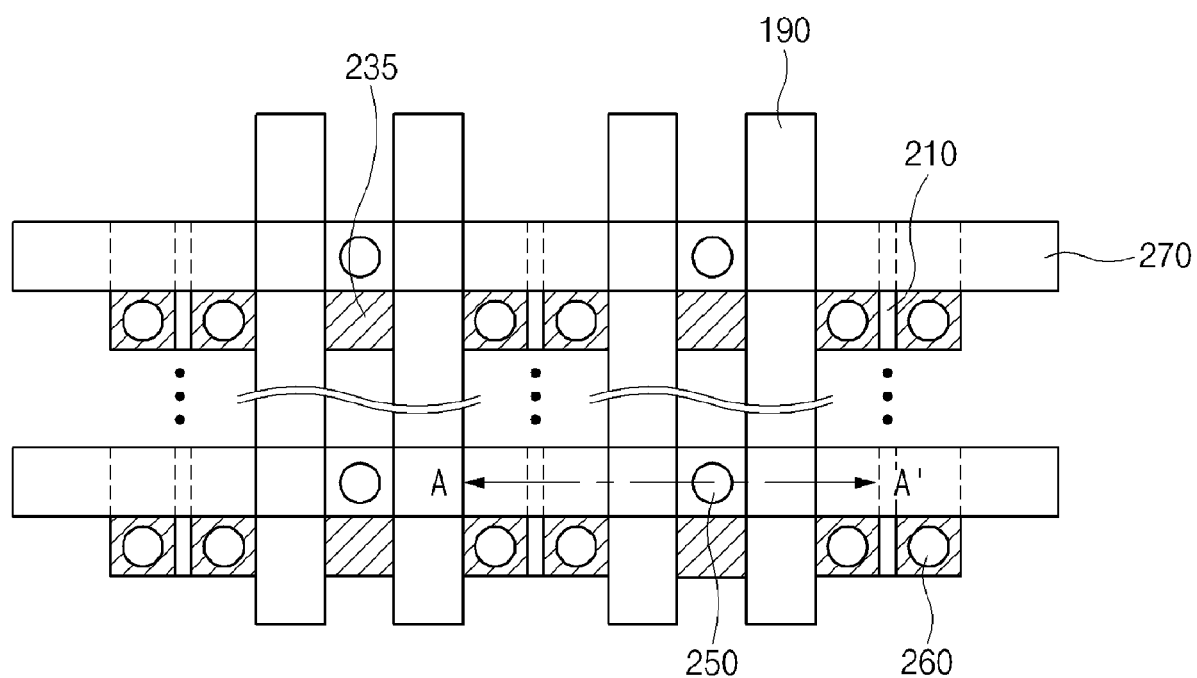
FIG. 1 is a plane view illustrating a method of manufacturing a semiconductor device according to an embodiment of the present invention; and, FIGS. 2a to 2j are cross-sectional views illustrating a method of manufacturing a semiconductor device according to an embodiment of the present invention.

While the disclosed invention is susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DETAILED DESCRIPTION

Preferred embodiment of the invention will now be described in detail referring to the accompanying drawings, in order to convey its spirit to the ordinary person skilled in the art. Also, the thickness of a layer and the sizes of regions may be exaggerated for sake of convenience in the drawings.

FIG. 1 is a plane view illustrating a semiconductor device and a manufacturing method thereof according to an embodiment of the present invention. FIG. 1 shows active regions 235, isolation regions 210, gates 190, storage node contacts 260, bit line contacts 250, and bit lines 270.

The active regions 235 are arranged to have an island formation. The isolation regions 210 are formed between the active regions 235. The plural gates 190 are formed through the process of etching the active regions 235 to form trenches (not shown), filling a conductive material into the trenches, and dividing the filled conductive material into two parts. In other words, the filled gates 190 are formed to perpendicularly intersect with the longitudinal direction of the active regions 235. Accordingly, each of the active regions 235 is divided into three divisional regions by means of the plural filled gates 190.

The storage node contacts 260 are formed in both outer divisional regions of each active region which are exposed between the gates 190, and the bit line contacts 250 are formed in the central divisional regions of the active regions 235. The bit line contacts 250 are connected to the bit lines 270 and the bit lines 270 are arranged in parallel to the active regions 235.

FIGS. 2a to 2j are cross-sectional views illustrating a semiconductor device and a manufacturing method thereof according to an embodiment of the present invention. FIGS. 2a to 2j show a cross-sectional surface of the semiconductor device taken along the line A-A' in FIG. 1.

Figure 2A:
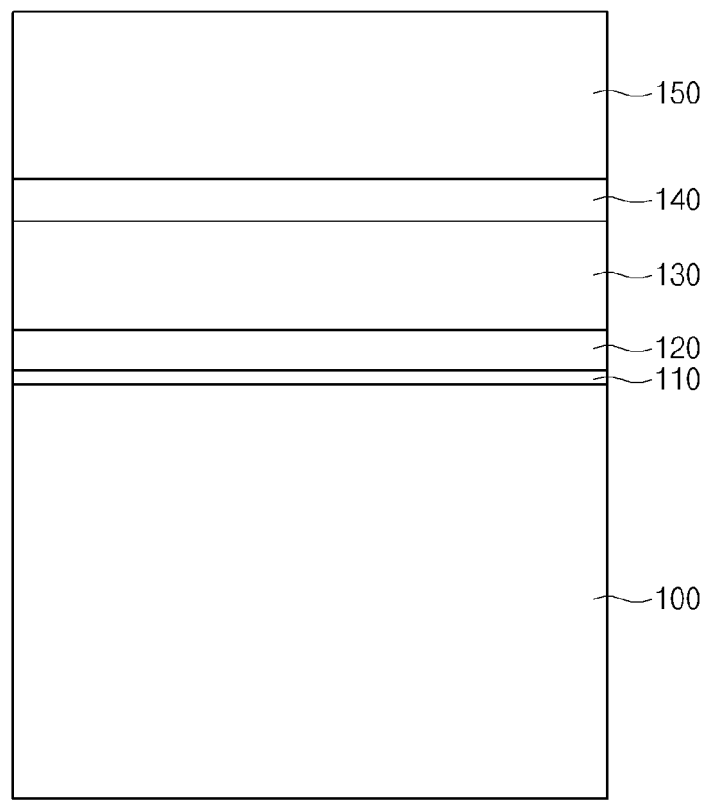
Figure 2B:
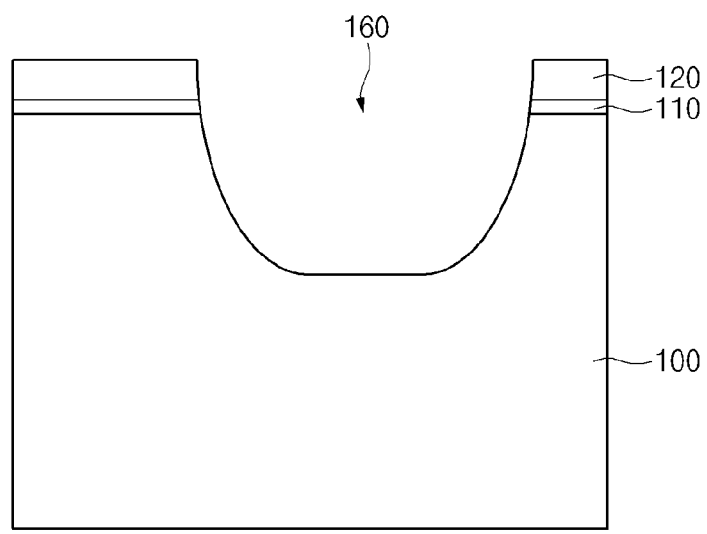

Referring to FIGS. 2a and 2b, a pad oxide film 110 and a pad nitride film 120 are sequentially deposited on the semiconductor substrate 100 before forming a hard mask layer 130 and an anti-reflection film 140 on the pad nitride film 120. Also, a photo resist film 150 is formed on the anti-reflection film 140. The photo resist film is patterned in a photo resist film pattern (not shown) through an exposure process using a trench mask and a development process. Then, the anti-reflection film 140, hard mask layer 130, pad nitride film 120, pad oxide film 110, and semiconductor substrate 100 are etched using the photo resist film pattern as a mask, thereby forming a trench 160.

Figure 2C:
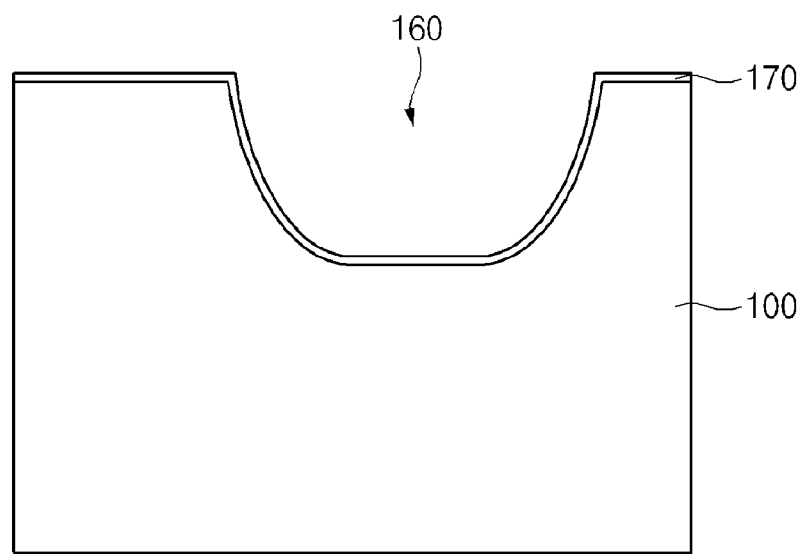

Referring to FIG. 2c, an oxidation process is performed to form a first oxide film on the semiconductor substrate 100 after removing the pad nitride film 120 and the pad oxide film 110. The first oxide film 170 prevents surface damage to the semiconductor substrate 100 during ion implantation which is included in the following process and is used in the formation of a transistor.

Although it is not shown in the drawings, the method according to an embodiment of the present invention implants N-type dopant ions into the lower portion of the semiconductor substrate 100 in order to form a deep N-well. The dopant ions are implanted using an energy of about 1.0 MeV. The dopant ions include phosphorous (P) ions (P-ions). After forming the deep N-well, a light ion implantation for forming a cell well is performed. At this time, boron (B) ions are implanted into the semiconductor substrate 100 using about 300 KeV of energy. Then, a field stop layer for the cell well is formed by implanting boron B ions into the cell well region using about 120 KeV of energy. The field stop layer may prevent leakages caused by the adjacent cell wells. Next, first and second N-minus ion implantations are sequentially performed. The first N-minus ion implantation allows phosphorous (P) ions to be implanted using about 25 KeV of energy. The second N-minus ion implantation also allows boron (B) ions to be implanted using about 20 KeV of energy. The multiple ion implantations enable a lightly doped drain structure to be formed in the low surface resistance.

Figure 2D:
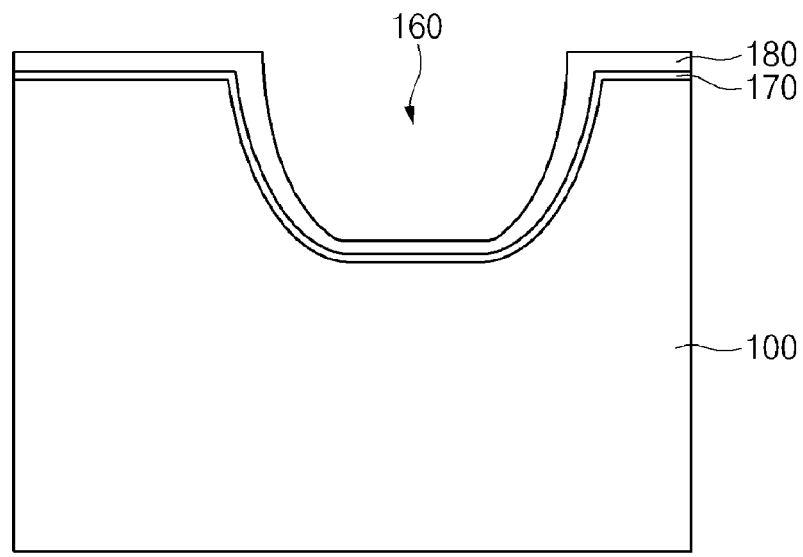

Referring to FIG. 2d, a second oxide film 180 is deposited using an oxidation process. The portions of the second oxide film 180, which are positioned on the bottom surface and side wall of the trench 160, may be used as a gate channel during the following process.

Figure 2E:
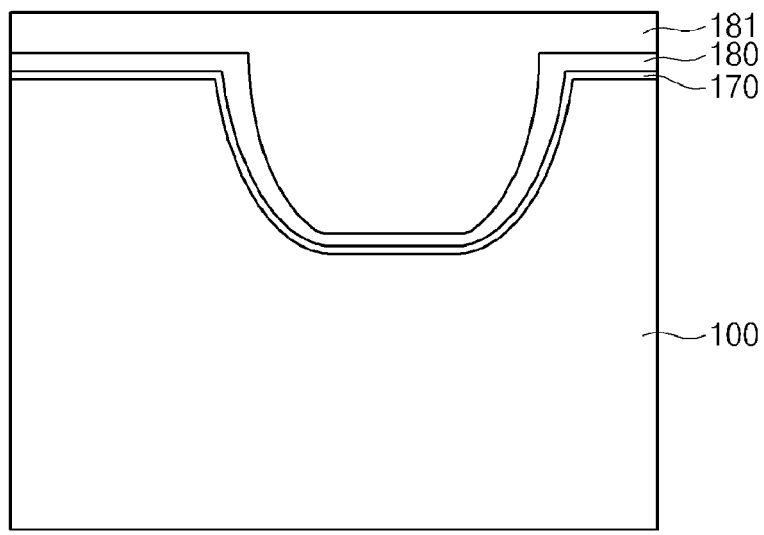

Referring to FIG. 2e, filled gates 181 including a gate poly film, a barrier metal film, and a conductive layer are sequentially formed on the entire surface of the semiconductor substrate 100 including the second oxide film 180.

Figure 2F:
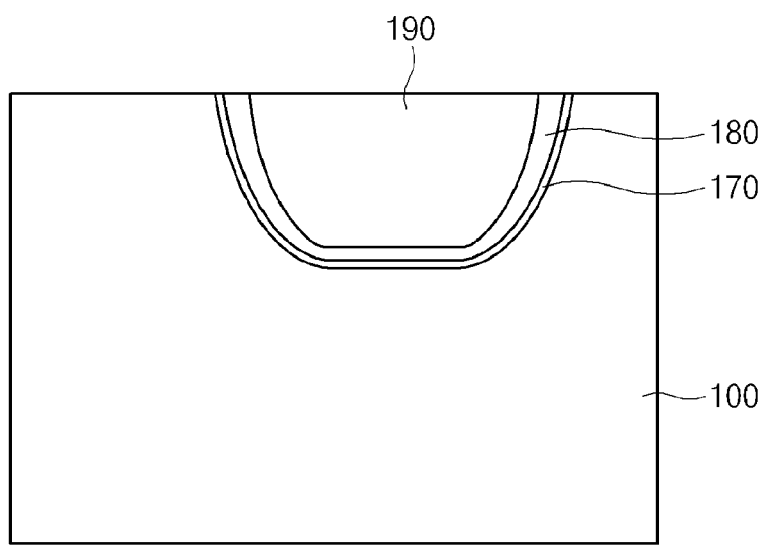

Referring to FIG. 2f, the conductive layer, the barrier metal film, and the gate poly film are planarized until the semiconductor substrate 100 is exposed, thereby forming a plurality of filled gate patterns 190. After the formation of the filled gate patterns 190, another oxidation process is performed.

Figure 2G:
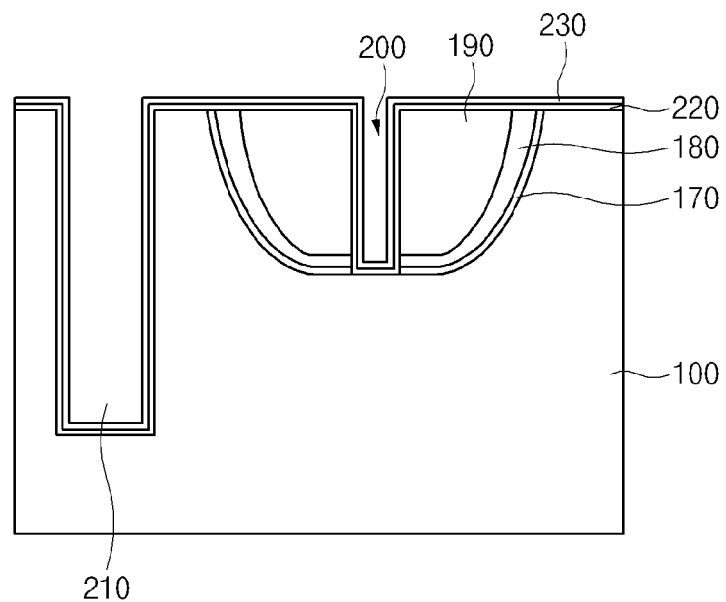

Referring to FIG. 2g, a photo resist film (not shown) is formed on the entire surface of the semiconductor substrate 100 including the filled gate patterns 190. A photo resist pattern (not shown) is formed by an exposing and developing process using a bit line contact region mask. A center portion of the filled gate patterns 190 are etched with the photoresist pattern as a mask to form a bit line contact region 200.

After forming a bit line contact region 200, the semiconductor substrate 100 is etched to form isolation region 210 to separate contacts which will be formed by the following process. It is preferable for the isolation region 210 to be formed deeper than the bit line contact region 200.

Then, a third oxide film 220 and a nitride film 230 are deposited on the entire surface of the semiconductor substrate 100 including the bit line contact region 200. The third oxide film 220 is formed by performing the oxidation on the entire surface of the semiconductor substrate 100. The nitride film 230 prevents the diffusion of boron B implanted at the ion implantation.

Figure 2H:
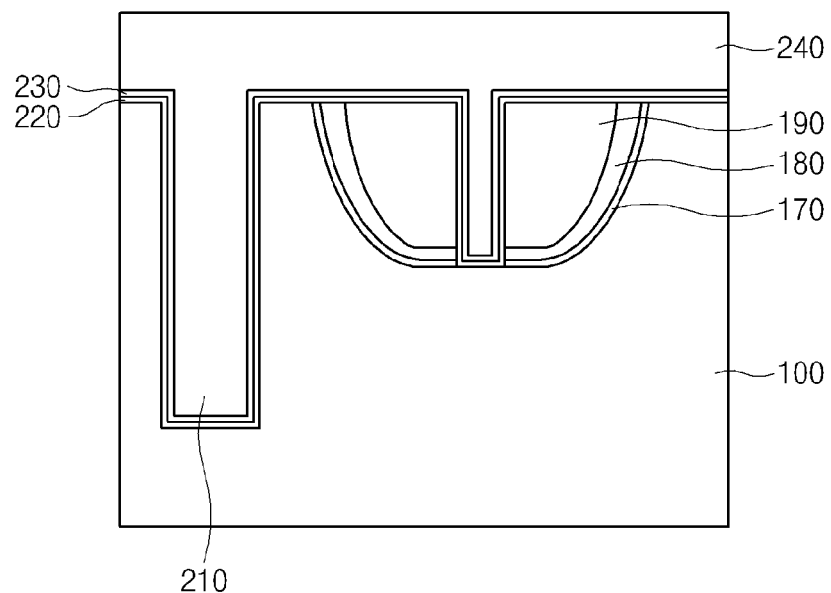

Referring to FIG. 2h, another oxide film 240 is formed on the entire surface of the nitride film 230 including the bit line contact region 200. The oxide film 240 includes a high density plasma (HDP) layer. This oxide film 240 is hardened through an annealing process and is planarized.

Figure 2I:
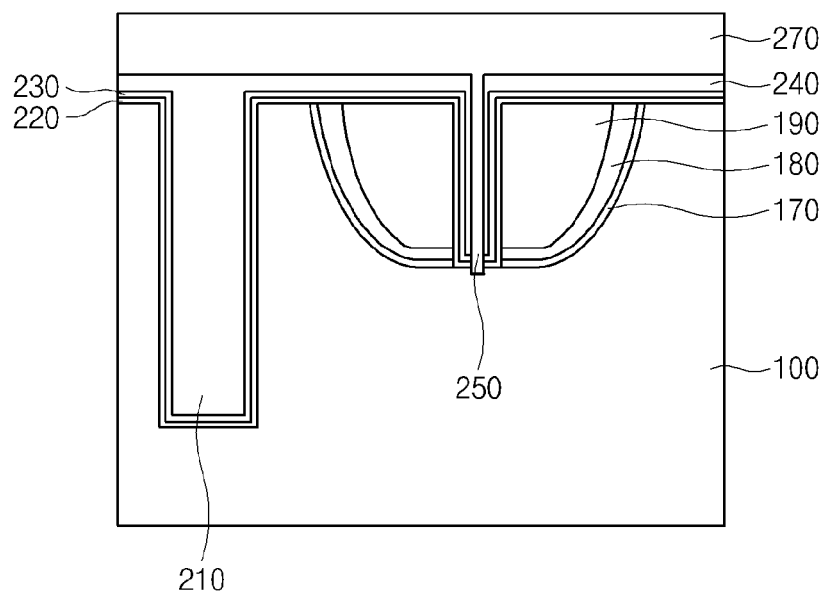
Figure 2J:
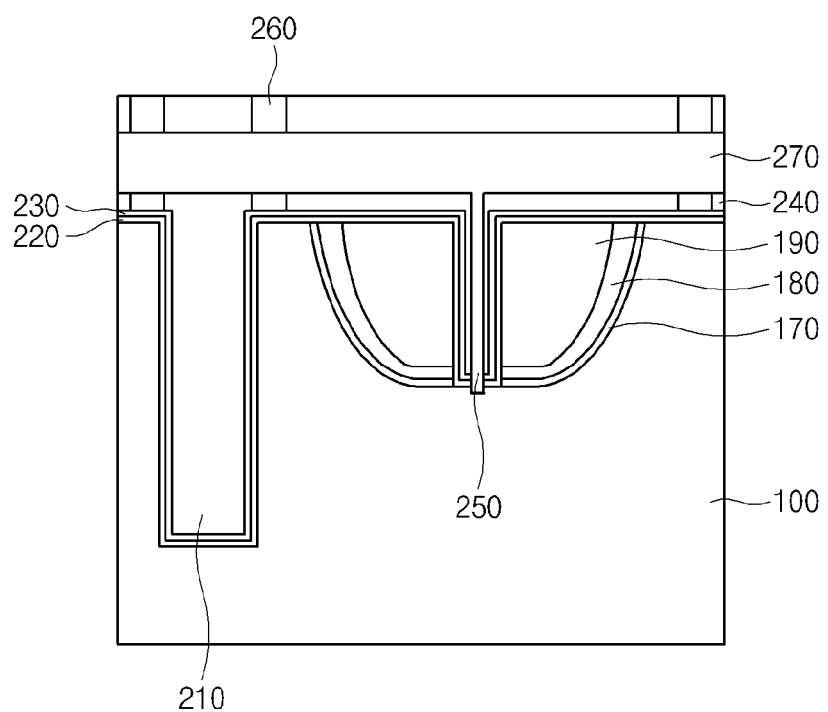

Referring to FIG. 2i to 2j, photo resist film (not shown) is formed on the entire surface of the oxide film 240. A photoresist pattern (not shown) is formed by an exposing and developing process using a bit line contact mask. After the oxide film 240 is etched with the photoresist pattern as a mask, ion implantation is performed. A bit line 270 including a barrier metal film, a conductive layer, a hard mask layer, and a nitride film is stacked on the entire surface of the oxide film 240 having the etched region so that a bit line contact 250 is formed together with the bit line 270.

Regions of the oxide film 240 on which storage node contacts 260 will be formed by the following process is etched. A conductive layer is filled in the regions of the oxide film 240 in order to form the storage node contacts 260. The storage node contacts 260 are separated from each other by the isolation region 210 and are connected to an upper structure material. The structure, including the bit line contacts 250 and the storage node contacts 260 as described above, can remove the landing plugs in the related art and are advantageous in the high integration of the semiconductor device.

As described above, according to the embodiment of the present invention, a semiconductor device and a manufacturing method thereof include steps of etching a semiconductor substrate to form a trench, and separating a conductive material filled in the trench to form a bit line contact region and plural gate patterns. Because the filled gate instead of the recess gate, is formed on the side wall of the etched active region, the gate channel is formed in a three dimensional shape (not in a planar shape), so that the effective length of the channel increases. In other words, the reduced channel length due to the high integration of a semiconductor device may be prevented. Also, the generation of horns caused by an etching process in the formation of the recess gate is prevented so that the threshold voltage is not deteriorated. As a result, the productivity of semiconductor devices may be improved.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method of manufacturing a semiconductor device the method comprising:
   etching a semiconductor substrate to form a trench;
   filing the trench with a conductive material;
   exposing the semiconductor substrate through planarization after filling the trench with the conductive material;
   separating the conductive material to form a bitline contact region and a plurality of buried gate patterns; and
   etching the semiconductor substrate to define an isolation region.

2. The method according to claim 1, wherein formation of the trench comprises:
   depositing a hard mask layer on the substrate;
   forming a photo resist pattern on the hard mask layer; and,
   etching the hard mask layer and the substrate using the photo resist pattern as a mask.

3. The method according to claim 1 further comprising depositing an oxide film on the trench.

4. The method according to claim 1, wherein the isolation region is etched to a depth greater than a depth of the buried gate patterns.

5. The method according to claim 1, further comprising:
   depositing an oxide film and a nitride film on the entire surface of the semiconductor substrate including the bit line contact region;
   depositing an insulation film on the nitride film;
   etching the insulation film within the bit line contact region and filling another conductive material in the etched bit line contact region to form a bit line contact; and,
   forming a bit line over the bit line contact, the bit line comprising, as a stacked structure, a barrier metal layer, a conductive layer, and a hard mask nitride film.

6. The method according to claim 5, wherein the insulation film comprises an oxide film.

7. The method according to claim 5, further comprising:
   etching the insulation film to form storage node contacts separated by an isolation region.

8. A semiconductor device comprising:
   a plurality of gate patterns filled in a semiconductor substrate;
   an isolation region formed by etching the semiconductor substrate;
   a bit line contact of filled type defining the plurality of gate patterns; and
   a storage node contact separated from each other by the isolation region.

9. The semiconductor device according to claim 8, further comprising a bit line formed on the bit line contact.

* * * * *